United States Patent
Beyne

(10) Patent No.: US 11,367,705 B2
(45) Date of Patent: Jun. 21, 2022

(54) METHOD FOR PACKAGING SEMICONDUCTOR DIES

(71) Applicant: IMEC VzW, Leuven (BE)

(72) Inventor: Eric Beyne, Heverlee (BE)

(73) Assignee: IMEC vzw, Leuven (BE)

( * ) Notice: Subject to any disclaimer, the term of this patent is extended or adjusted under 35 U.S.C. 154(b) by 57 days.

(21) Appl. No.: 16/719,680

(22) Filed: Dec. 18, 2019

(65) Prior Publication Data

US 2020/0203309 A1 Jun. 25, 2020

(30) Foreign Application Priority Data

Dec. 20, 2018 (EP) .................................. 18214441

(51) Int. Cl.
*H01L 23/00* (2006.01)
*H01L 21/56* (2006.01)
(Continued)

(52) U.S. Cl.
CPC ............ *H01L 24/94* (2013.01); *H01L 21/565* (2013.01); *H01L 22/32* (2013.01); *H01L 24/05* (2013.01);
(Continued)

(58) Field of Classification Search
CPC ....... H01L 24/94; H01L 21/565; H01L 22/32; H01L 24/05; H01L 24/81; H01L 25/0657; H01L 25/50
See application file for complete search history.

(56) References Cited

U.S. PATENT DOCUMENTS

| 9,865,567 B1* | 1/2018 | Chaware ............ H01L 25/0655 |
| 2010/0123217 A1* | 5/2010 | Poeppel ............. H01L 25/0655 |
| | | 257/536 |

(Continued)

FOREIGN PATENT DOCUMENTS

EP        3 288 076 A1      2/2018

OTHER PUBLICATIONS

Extended European Search Report dated Apr. 17, 2019, in Application No. 18214441.0.
(Continued)

*Primary Examiner* — Robert G Bachner
(74) *Attorney, Agent, or Firm* — Knobbe, Martens, Olson & Bear, LLP

(57) ABSTRACT

A method of using sacrificial structures in a mold substrate for packaging a first die and one or more second dies or stacks thereof is disclosed. The method allows testing of the first die prior to mounting the second dies, without requiring a TSV insert. In one aspect, a block of sacrificial material is embedded together with the first die in a first mold substrate and to one side of the first die. The removal of the block creates an opening. The method is configured so that contacts are exposed at the bottom of the opening, the contacts being electrically connected to corresponding contacts on the first die. This may be realized by bonding both the die and the sacrificial block to a redistribution layer, or by mounting a bridge device between the first die and the block prior to a first overmolding applied for producing the first mold substrate. A second die or a stack of second dies is mounted in the opening and bonded to the exposed contacts, after which a second mold substrate is produced, embedding the second die or dies.

13 Claims, 5 Drawing Sheets

(51) Int. Cl.
 *H01L 21/66* (2006.01)
 *H01L 25/065* (2006.01)
 *H01L 25/00* (2006.01)

(52) U.S. Cl.
 CPC .......... *H01L 24/81* (2013.01); *H01L 25/0657* (2013.01); *H01L 25/50* (2013.01)

(56) References Cited

U.S. PATENT DOCUMENTS

| | | |
|---|---|---|
| 2016/0133571 A1 | 5/2016 | Lee et al. |
| 2016/0358865 A1* | 12/2016 | Shih ........................ H01L 23/562 |
| 2017/0125334 A1* | 5/2017 | Wang ................... H01L 21/4857 |
| 2017/0287736 A1* | 10/2017 | Oster ...................... H01L 21/56 |

OTHER PUBLICATIONS

Jin et al., Next Generation eWLD (embedded Wafer Level BGA) Packaging, 2010 12$^{th}$ Electronics Packaging Technology Conference, Singapore, 2010, pp. 520-526.

\* cited by examiner

METHOD FOR PACKAGING SEMICONDUCTOR DIES

CROSS-REFERENCE TO RELATED APPLICATION

This application claims foreign priority to European Patent Application No. 18214441.0, filed Dec. 20, 2018, the contents of which are incorporated by reference herein in its entirety.

BACKGROUND

Technological Field

The disclosed technology is related to the integration of multiple integrated circuit dies in a 3D-interconnected package.

Description of the Related Technology 3D-integration of integrated circuit devices, also referred to as semiconductor chips or dies, has known many developments in recent years. In particular, the integration of two or more dies with a large number of die-to-die interconnects has become a challenge in terms of the size of the package and the heat dissipation problem. The traditional PoP (Package-on-Package) approach involves the packaging of two dies, for example an application processor in a mobile application and a memory chip, in separate ball-grid array type packages, and assembling one package on top of the other. The resulting package height may be problematic, and package-level solder balls do not allow to realize a large number of interconnections at small pitch, as it is required, for example, for realizing integration according to the Wide I/O standard.

One improvement that has been proposed is using an embedded die package or wafer-level reconstructed die package for the bottom die. The embedded die package embeds the silicon die in a mold substrate, such as a laminated PCB. The reconstructed package uses wafer-level molding technology to reconstruct a wafer or panel shaped substrate, which allows for the creation of thin film package-level interconnects in a redistribution layer (RDL). This technology is known as Fan-Out Wafer Level Packaging (FO-WLP) or eWLB, embedded Wafer Level Ball Grid Array, as illustrated, for example, in the article "Next Generation (embedded Wafer Level BGA) Packaging" by Yonggang Jin et al., Proceedings of Electronics Packaging Technology Conference (EPTC), 2010.

In order to enable a package-on-package solution, the FO-WLP approach requires vertical through-package interconnects, connecting the front of the package to the backside. This may be done by laser drilling and filling the holes with Cu or solder to produce through-package vias (TPVs). Another technique uses plating of Cu pillars before die embedding. The obtainable TPV pitch is, however, rather limited (e.g. TPV-to-TPV pitch not smaller than several 100 µm).

In order to enable the high bandwidth technology, such as required for High bandwidth Memory (HBM) or Wide I/O DRAM memory (which consists of 4 banks of 6×73 contact pads at a $40_1$.tm pitch) a much higher through-package interconnect density is required.

This can be enabled by direct stacking of the Wide I/O DRAM on the logic die, using through-Si vias in the logic die. This does however require TSVs (through silicon vias, or more generally through substrate vias) in the logic die. Also the thermal coupling between the logic die and the DRAM die is rather high. A different solution is the use of a silicon interposer to realize the high density interconnects using a high density silicon technology. This allows for lateral placement of the dies (i.e., side by side on the interposer). However the package construction becomes rather expensive. An alternative solution is to remove the package substrate and realize the package as a wafer-level Chip-scale package (CSP). These solutions do not, however, allow for an independent packaging and easy testing of the logic die.

The latter problem is solved for example by the method and package described in European Publication No. EP3288076A1, wherein a TSV insert is embedded in a mold substrate, and used in combination with a lateral connecting device for interconnecting a logic die to a wide I/O memory die. Despite the fact that it is technically straightforward to produce the TSV insert, the inclusion of this component represents a manufacturing cost of this solution.

U.S. Patent Publication No. 2017/0287736 discloses a method wherein 3D structures of a sacrificial material are produced prior to the application of the mold material. The sacrificial structures may be produced by 3D printing. After curing and setting of the mold material, the sacrificial structures are removed, thus creating cavities in the mold material.

SUMMARY OF CERTAIN INVENTIVE ASPECTS

The disclosed technology aims to provide a solution to the problems described above. This aim is achieved by the method and the resulting packages as disclosed herein. The method of the disclosed technology incorporates the use of sacrificial structures in a mold substrate for packaging a logic die and one or more memory dies in a way that allows testing of the logic die prior to mounting the memory dies, without requiring a TSV insert. The method is applicable to other types of dies than logic and memory dies, but the description is limited thereto for the sake of conciseness and clarity. A block of sacrificial material is embedded together with the logic die and to one side of the logic die, optionally adjacent to the logic die, in a first mold substrate. The removal of the block creates an opening. The method is configured so that contacts are exposed at the bottom of the opening, the contacts being electrically connected to corresponding contacts on the logic die. This may be realized by bonding both the die and the sacrificial block to a redistribution layer, or by mounting a bridge device between the die and the sacrificial block prior to the first overmolding step applied for producing the first mold substrate. Testing of the logic die may be done by accessing the contacts at the bottom of the opening. A memory die or a stack of memory dies is mounted in the opening and bonded to the exposed contacts, after which a second mold substrate is produced, embedding the memory die or dies and forming a reconstructed wafer which can then be singulated to form separate packages.

The disclosed technology is in particular related to a method for packaging one or more first semiconductor dies together with one or more second semiconductor dies electrically connected to the one or more first dies, wherein the method includes:

by a first overmolding step, embedding a first die together with a block formed of a sacrificial material in a first mold substrate, wherein the block is located to one side of the first die, optionally adjacent to the first die, removing the sacrificial material from the first mold substrate, to thereby create an opening in the first mold substrate, the bottom of the opening including exposed contacts which are electrically connected to the first die, bonding a second die or a stack of second dies to the bottom of the opening, thereby electrically connecting the second die or the stack of second dies to the exposed contacts, by a second overmolding step, embedding the second die or the stack of second dies in a second mold substrate, thereby forming an assembly of the first and second mold substrates into which assembly the first and second dies are packaged.

According to an embodiment, the first die and the sacrificial block are both attached to a redistribution layer (RDL) prior to the first overmolding step, the redistribution layer being releasably attached to a temporary carrier, and wherein:

the redistribution layer includes the contacts which are to be exposed at the bottom of the opening formed by the removal of the sacrificial block, the first die is electrically connected to the RDL, the RDL including circuitry which connects the first die to the contacts which are to be exposed at the bottom of the opening formed by the removal of the sacrificial block, after the first overmolding step and before the step of removing the sacrificial material, at least part of the mold substrate is thinned so as to expose an upper surface of the sacrificial block, In the previous embodiment, the thinning step may include grinding the surface of the first mold substrate.

According to an embodiment, the thinning step exposes a surface of the first die, and the method further includes attaching an additional sacrificial block to the exposed surface of the first die, prior to the second overmolding step, and the additional sacrificial block is removed from the second mold substrate, so as to create a cavity above the first die.

According to an embodiment:

the first overmolding step is performed on a first temporary carrier to which the first die and the sacrificial block are attached, and wherein a bridge device overlaps the first die and the sacrificial block, the bridge device having a first surface that is attached to the first die and a second surface placed in contact with the block, the first and second surface being on the same side of the bridge device, the first and second surfaces including, respectively, a first and a second array of electrical contacts which may be individually interconnected inside the bridge device, and wherein the first array of contacts is bonded and electrically connected to corresponding contacts on the first die, the first mold substrate is released from the first temporary carrier, flipped and attached to a second temporary carrier, followed by the step of removing the sacrificial material of the block, thereby creating the opening, wherein the exposed contacts at the bottom of the opening are the contacts of the second array of contacts on the second surface of the bridge device.

The method according to the previous embodiment may further include:

after the first overmolding step, thinning the first mold substrate, including the bridge device, until a set of contact bumps on the first die is exposed, forming a redistribution layer on the thinned first mold substrate, the redistribution layer including circuitry that is electrically connected to the exposed contact bumps on the first die, wherein releasing the first mold substrate from the first temporary carrier is executed by releasing the assembly of the first mold substrate and the redistribution layer.

According to an embodiment, the assembly of the first and the second mold substrate, and—if applicable—the redistribution layer forms at least part of a reconstructed wafer, and the method further includes singulating the reconstructed wafer to form a package including the first die and the second die or including the first die and the stack of second dies.

The method according to any one of the previous embodiments may further include testing the first die prior to bonding the second die or the stack of second dies, the testing taking place by accessing the first die via the exposed contacts at the bottom of the opening formed by removing the sacrificial material of the block.

In the method according to any one of the previous embodiments, the block formed of sacrificial material may be produced by 3D printing. In any embodiment, the one or more first dies may be logic dies, and the one or more second dies may be memory dies.

The disclosed technology is also related to a wafer assembly including a carrier, to which a mold substrate is removably attached, the mold substrate including a first die embedded therein, and wherein the mold substrate includes an opening located to one side of the first die, optionally adjacent to the first die, wherein the opening is open to the surface of the mold substrate, the bottom of the opening comprising exposed contacts which are electrically connected to the first die.

According to an embodiment of the wafer assembly of the disclosed technology, the mold substrate is attached to a redistribution layer (RDL) that is itself releasably attached to the carrier, and:

the first die is electrically connected to the RDL, the RDL includes the exposed contacts at the bottom of the opening, the RDL includes circuitry which connects the first die to the contacts which are exposed at the bottom of the opening.

In a wafer assembly according to the disclosed technology, the first die may be attached to a bridge device that is co-embedded in the first mold substrate, the bridge device having a first surface that is attached to the first die and a second surface at the bottom of the opening, the first and second surface being on the same side of the bridge device, the first and second surfaces including, respectively, a first and a second array of electrical contacts which may be individually interconnected inside the bridge device, and wherein the first array of contacts is bonded and electrically connected to corresponding contacts on the first die.

DETAILED DESCRIPTION OF CERTAIN ILLUSTRATIVE EMBODIMENTS

Figure 1A:
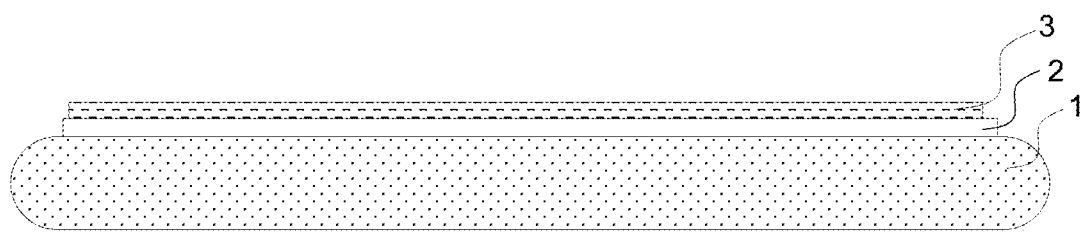
FIGS. 1A to 1I illustrate the method of the disclosed technology according to a first embodiment.

According to a first embodiment of the method of the disclosed technology, a temporary carrier substrate 1 is provided, having an adhesive layer 2 on its surface, as illustrated in FIG. 1A. Any type of temporary carrier 1 and adhesive 2 known as suitable for the construction of fan-out wafer level packages may be used, for example a silicon or glass wafer 1 with the adhesive 2 applied thereto by soft baking or spin coating. A redistribution layer 3 is produced on the adhesive 2. As known by the skilled reader, a redistribution layer 3 is similar in structure to the back end of line part of a semiconductor die, including one or more levels of metal interconnects embedded in an inorganic or organic dielectric material. Throughout this description of the disclosed technology, the term "redistribution layer," abbreviated RDL, refers to a single layer or to stack of multiple layers as described above.

Figure 1B:
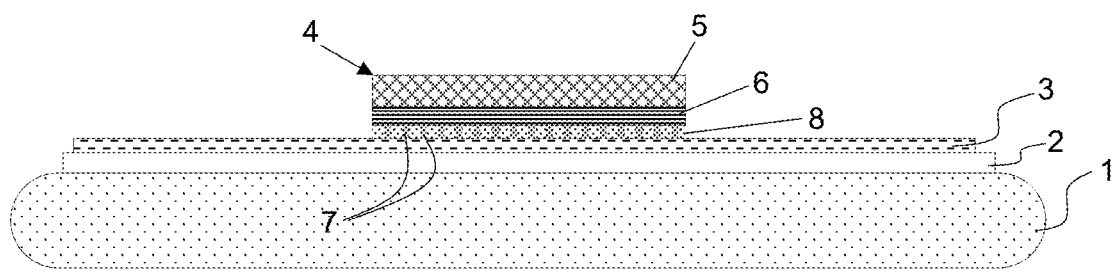

Then a logic die 4 is bonded to the RDL 3, as shown in FIG. 1B. The die 4 includes a semiconductor substrate portion 5 and an active portion 6, with solder bumps 7 on top of the active portion 6. The active portion 6 is typically formed of a front end of line part including active devices processed on the semiconductor substrate portion 5 and a back end of line part including interconnects between the active devices and the solder bumps 7. The logic die 4 is bonded to the RDL 3 by bonding the solder bumps 7 of the die to suitable contacts (not shown) on the upper layer of the RDL 3. A layer of underfill material 8 is applied, filling the space between the bumps 7. The underfill 8 may be applied in any suitable manner, either during bonding of the die 4 or thereafter. Instead of solder bumps 7 extending outward from the surface, the die 4 may be provided with planar contact pads or other suitable contact structures. The side of the die 4 including the bumps 7 or equivalents is referred to as the front side of the die 4.

The contact bumps 7 or equivalents include at least one array of I/O contacts intended to be connected individually to a corresponding array of I/O contacts on a memory die or a stack of memory dies which is/are to be packaged together with the logic die 4, "individually" meaning that each contact of one array is connected to a corresponding contact of the other array. The array of I/O contacts may be a dense array of contacts in accordance with the Wide I/O standard.

Figure 1C:
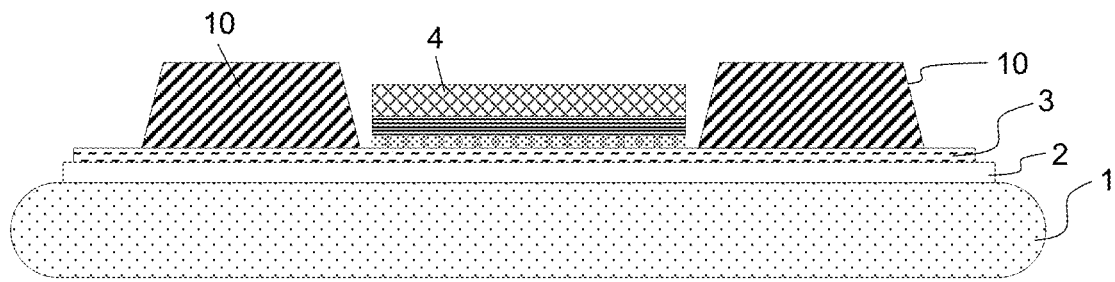

The next step (shown in FIG. 1C) is the creation of two 3-dimensional structures 10 formed of a sacrificial material, on the RDL 3. The structures may have a square or rectangular cross-section as seen in a plane parallel to the substrate 1, and are hereafter referred to as "blocks." The blocks 10 are produced on either side of the logic die 4, i.e., each block 10 is located to one side of the logic die 4. The blocks 10 may be produced by 3D printing, stencil printing, lithography and etching or any other suitable technique. The sacrificial material is a material that may be removed by wet etching or solvent removal after the structures have been embedded in a mold material, in any suitable manner, for example from the above-cited U.S. Publication No. 2017/0287736. The sacrificial material may be for example a polymer, a temporary bonding adhesive, or a metal.

Figure 1D:
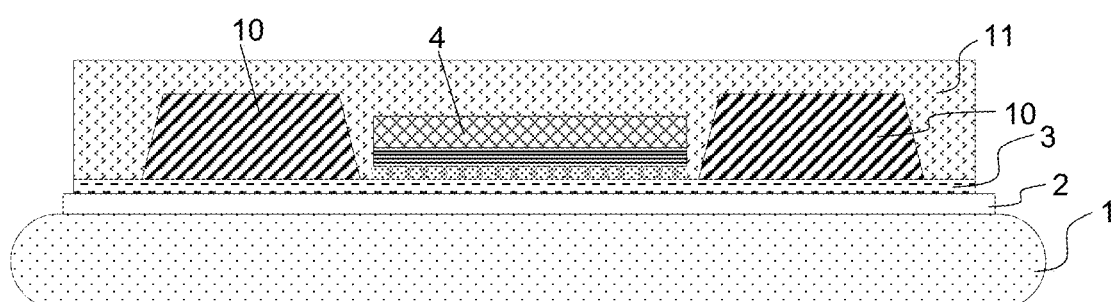
Figure 1E:
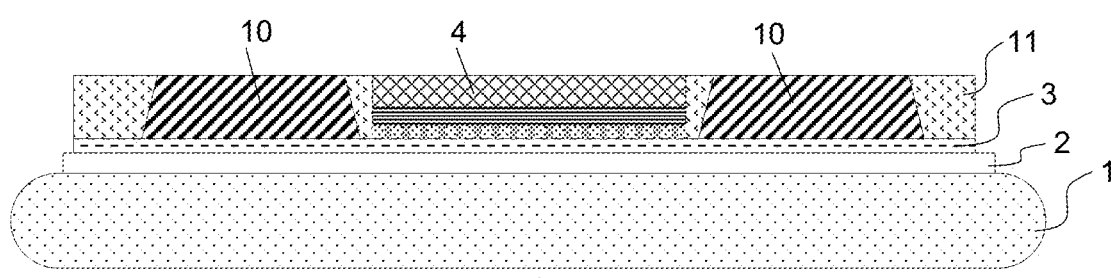

As illustrated in FIG. 1D, a mold substrate 11 is then produced by a first overmolding step on the adhesive layer 2 in any suitable manner, including existing wafer level packaging techniques. Compression molding or transfer molding may be applied by deposition of a mold compound that is typically a mixture of particles and a thermosetting polymer, for example a thermosetting polymer with >80% silica particles. The mold material covers the adhesive layer 2 and envelopes the contours of the die 4 and the blocks 10. A post-mold curing step is then applied to obtain a fully set mold substrate 11 embedding the logic die 4 and the blocks 10, i.e., the die 4 and the blocks 10 are fully surrounded laterally and on top by the mold material. The mold substrate 11 is then thinned and planarized by a grinding step, as shown in FIG. 1E, to a thickness wherein an upper surface of the blocks 10 is exposed, possibly removing an upper layer of the blocks 10. In the embodiment shown, the back surface of the die 4 is equally exposed by this thinning step, but this is not a limitative requirement of the disclosed technology. The grinding of a mold substrate can be performed in any suitable manner, using for example a tool equipped with a rotatable grinding surface coated with a diamond powder. Other planarization techniques such as chemical mechanical polishing may be used instead of or in addition to the grinding step.

Figure 1F:
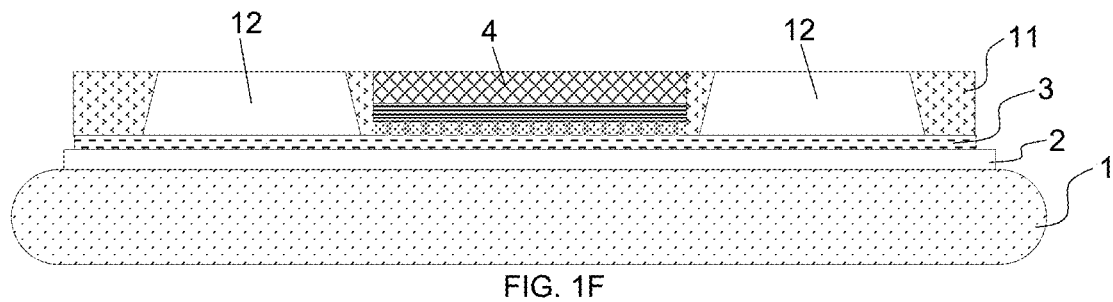

The sacrificial material of the blocks 10, that is now accessible via the exposed upper surfaces of the blocks, is then removed by a suitable technique, such as by a solvent-aided removal, by heating and melting the sacrificial material, or by etching (see FIG. 1F). As a result, two openings 12 are created in the mold substrate 11. At the bottom of the openings, a portion of the RDL 3 is exposed. The RDL design and the positioning of the blocks 10 are configured so that at the bottom of each of the openings 12, an array of contacts is exposed after the removal of the blocks 10, the array of contacts being connected individually to the array of I/O contacts on the logic die 4, through the circuitry of the RDL 3.

The intermediate product shown in FIG. 1F is suited for performing a test of the logic die 4. The die itself is already embedded in the mold substrate 11, while the contacts for accessing the die via the RDL 3 are exposed at the bottom of the openings 12. An operational test of the die 4 can therefore be performed at this stage without debonding the mold substrate 11 from its carrier.

Figure 1G:
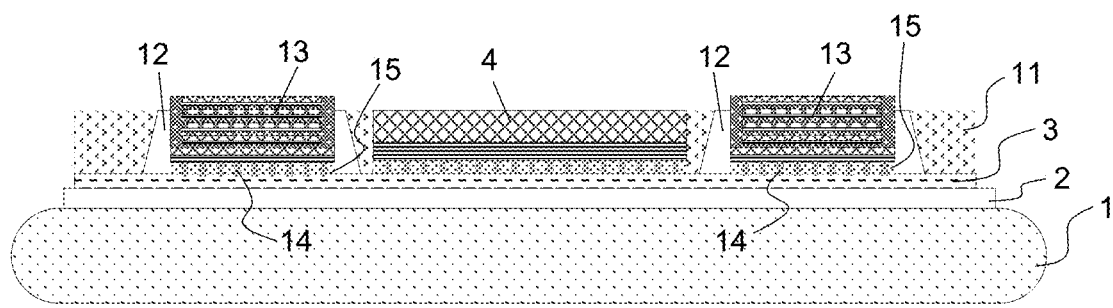

When the die 4 has been tested successfully, two stacks 13 of memory dies are bonded to the respective exposed RDL portions in the openings 12 (see FIG. 1G). The stacks may be any suitable DRAM memory die stacks. Each stack 13 is provided with an array of I/O contacts intended to be individually connected to a corresponding array on the logic die 4, through connections within the RDL 3. The die stacks 13 are bonded to the exposed contact arrays at the bottom of the openings 12 in any suitable manner, possibly including the application of an underfill layer 15, if the I/O contacts on the memory stack and/or the array of contacts on the RDL 3 are provided with solder bumps 14 or other contact structures protruding outward from the surface of the stack 13 and/or the RDL 3.

Figure 1H:
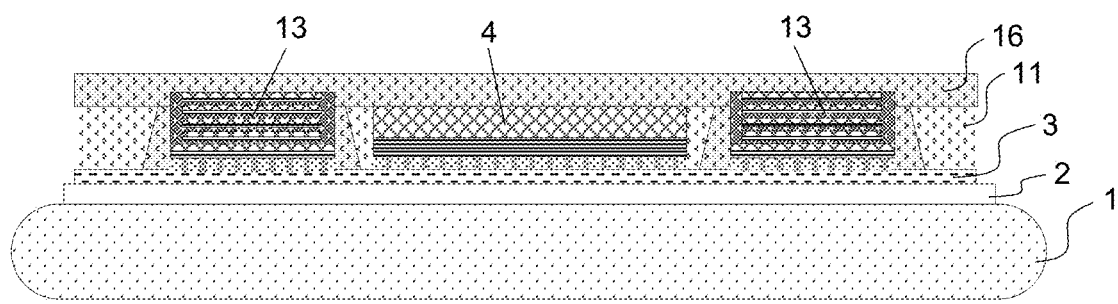
Figure 1I:
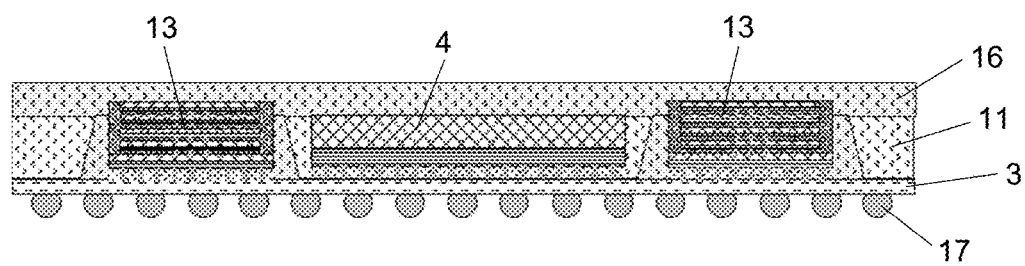

The next step is a second overmolding step (see FIG. 1H), whereby the mold material fills the openings 12 around the memory stacks 13 and forms a second mold substrate 16 on top of the first mold substrate 11, thereby effectively encapsulating the assembly of the logic die 4 and the memory die stacks 13 in a reconstructed wafer formed of the stack of mold substrates 11 and 16 and the RDL 3. This is followed by the release of the reconstructed wafer from the adhesive layer 2, and the production of package level solder balls 17 on the underside of the wafer (see FIG. 1I). After this, the reconstructed wafer may be singulated to form separate packages. Alternatively, the packages may be singulated prior to releasing them by performing a depth controlled dicing of the reconstructed wafer while it is still attached to the adhesive layer 2. The dicing stops in the adhesive layer 2.

Figure 2A:
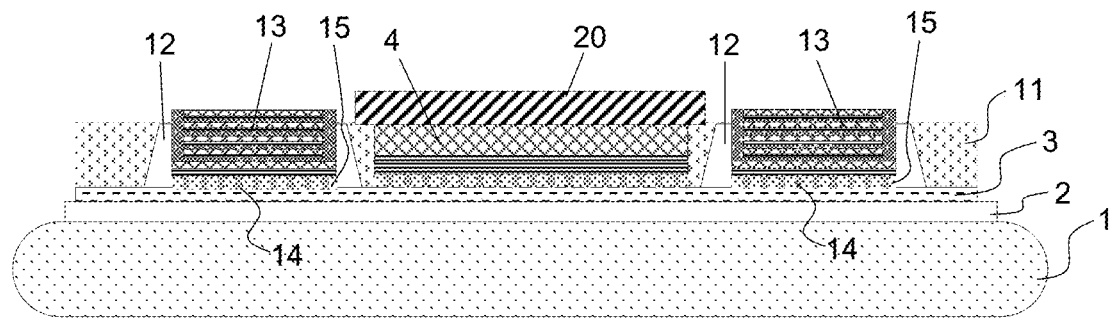
FIGS. 2A to 2C illustrate possible alternative further processing steps of the first mold substrate produced by the method according to Figures 1A to 1G.
Figure 2B:
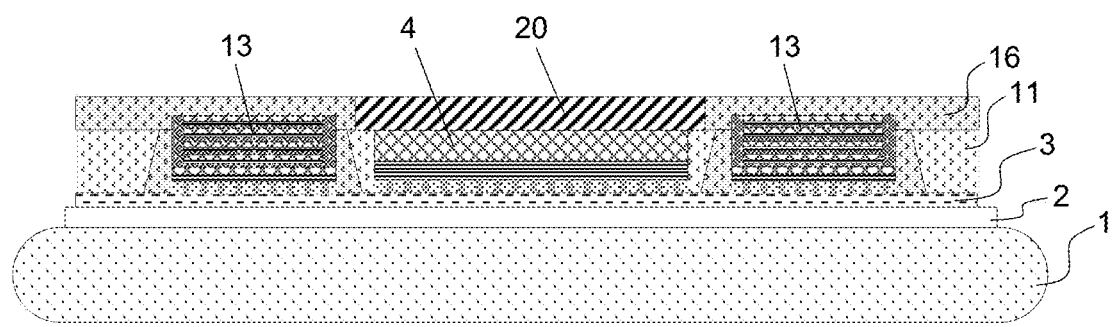
Figure 2C:
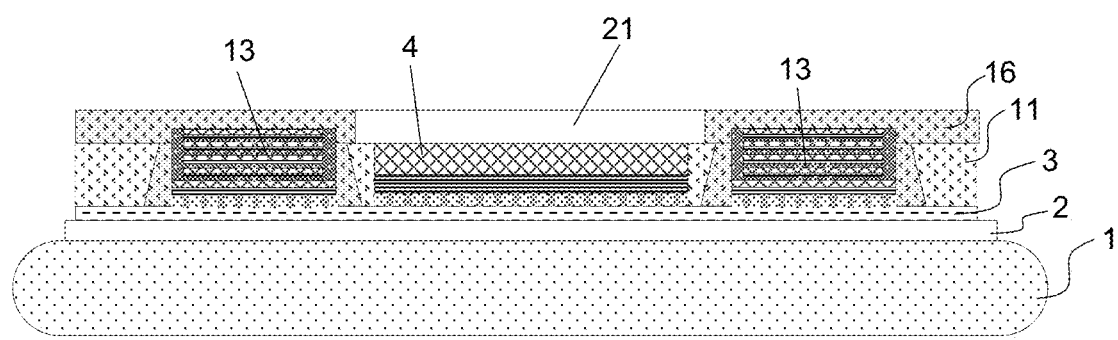

According to an embodiment illustrated in FIGS. 2A to 2C, an additional sacrificial material block 20 is produced on the exposed back surface of the logic die 4, after thinning the first mold substrate 11 and prior to the second overmolding step. The second overmolding step then takes place, followed by thinning the second mold substrate 16 until an upper surface of the block 20 is exposed. The block 20 is then removed, leaving a cavity 21 above the logic die 4, which may be used for the purpose of cooling the die 4.

FIGS. 3A to 3I illustrate another embodiment of the method of the disclosed technology. The logic die 4 has now been bonded by attachment of the backside of the die to the adhesive layer 2 on the temporary substrate 1. The contact bumps 7a and 7b are directed upward. For the sake of explaining this embodiment, the bumps have been represented as including a first set 7a which is an array of I/O contacts destined to be connected individually to corresponding I/O contacts on a memory die or a memory die stack. The bumps of the array 7a can be actual bumps of a given height, or equivalent contact structures, such as planar contact pads. The remaining contacts 7b are actual bumps which have a non-zero height measured from the front surface of the die 4.

Figure 3A:
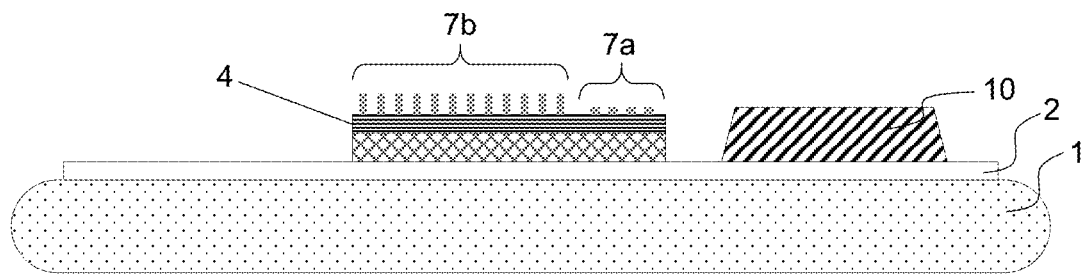
FIGS. 3A to 3I illustrate the method according to a second embodiment.
Figure 3B:
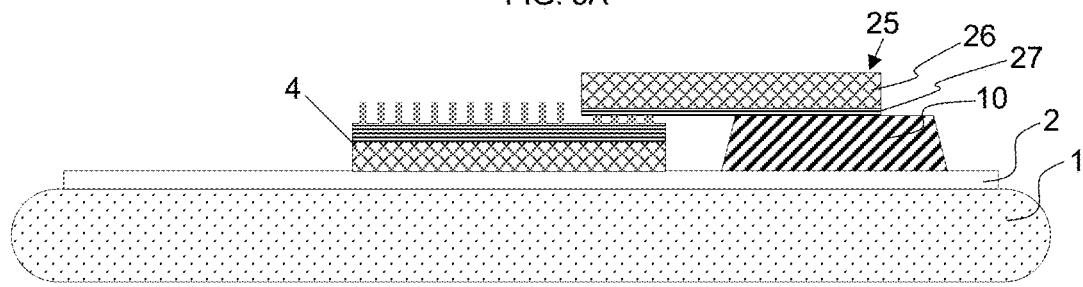
Figure 3C:
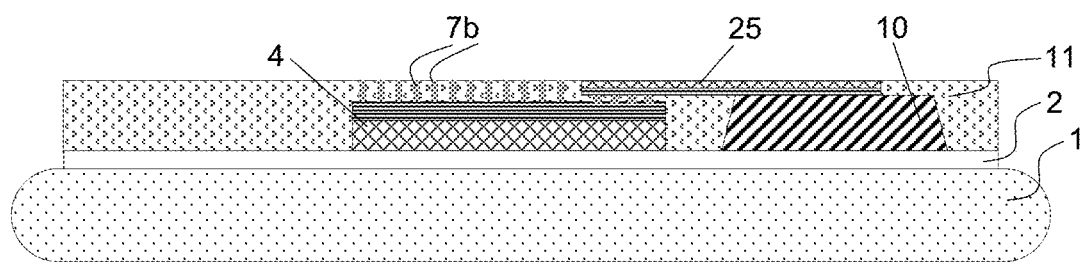
Figure 3D:
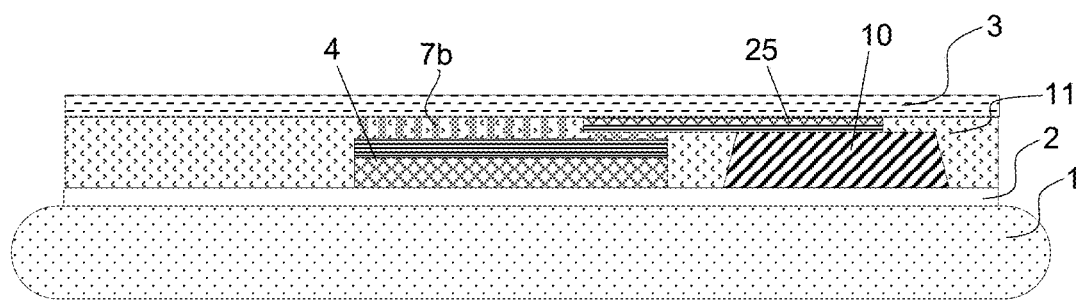

A block 10 of sacrificial material is produced adjacent the logic die 4, equally attached to the adhesive layer 2. The block 10 may be produced by 3D printing or any other suitable technique, including those cited with respect to the previous embodiments. The height of the block 10 is as close as possible to the height of the logic die 4, including the height (if any) of the I/O contacts 7a. A bridge device 25 is then bonded to the logic die (FIG. 3B). The bridge device may be a device described as a "lateral connecting device" in European Publication No. EP3288076A1. The bridge device 25 includes two arrays of contacts, respectively, on a first and second surface of the bridge device, the first and second surface being on the same side of the bridge device. In the device shown in the drawings, the first and second surface are sub-parts of the front surface of the bridge device. Each array has the same number of contacts as the array of I/O contacts 7a on the logic die 4. The contacts of the first array of the bridge device are individually connected to corresponding contacts of the second array of the bridge device by circuitry provided in the bridge device 25 itself. The bridge device 25 is basically a semiconductor die having a substrate portion 26 and a back end of line portion 27, the latter comprising the interconnecting circuitry between the two contact arrays on the front surface of the bridge device 25. The arrays of contacts on the bridge device 25 are arrays of planar contacts in the embodiment shown in the drawings. Alternatively, these contacts could be formed of other contact structures such as solder bumps or one array could be planar with the other consisting of solder bumps. While being bonded to the logic die 4, the bridge device 25 is placed onto the sacrificial block 10, so that any protruding contact structures on the bridge device 25 are embedded into the material of the block 10. The sacrificial material is sufficiently soft at the temperature applied during bonding of the bridge device 25 to the logic die 4, so as to allow a degree of embedding of the contact structures of the bridge device 25 in the sacrificial block 10.

The assembly of the logic die 4, the sacrificial block 10 and the bridge device 25 is now embedded in a first mold substrate 11, by a first overmolding step followed by grinding and planarizing the mold substrate 11 (see FIG. 3C), which includes thinning the bridge device 25 from the backside. The thinning step is done so as to expose the bumps 7b of the logic die 4. The height of these bumps must therefore be configured in accordance with the required height of the thinned bridge device 25. A redistribution layer 3 is then formed on the thinned mold substrate 11 (FIG. 3D), the RDL 3 including circuitry connected to the exposed bumps 7b of the logic die 4.

Figure 3E:
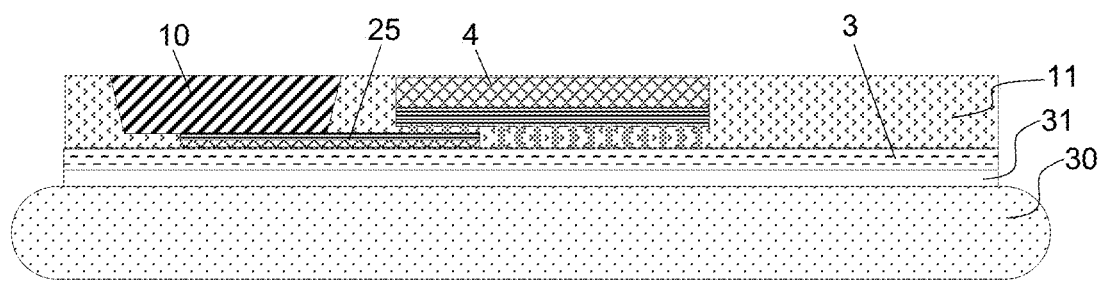
Figure 3F:
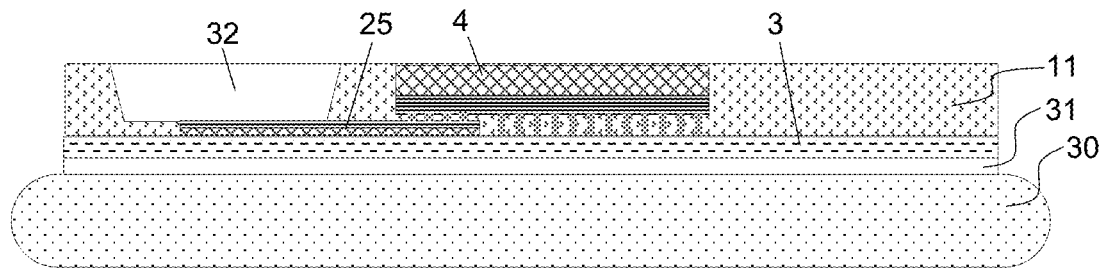
Figure 3G:
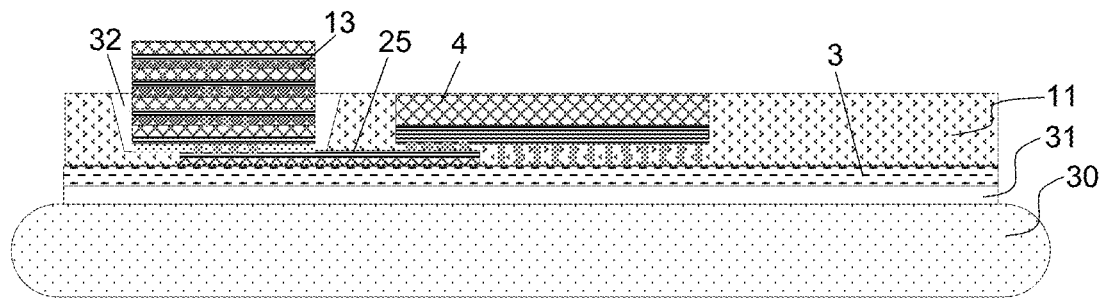
Figure 3H:
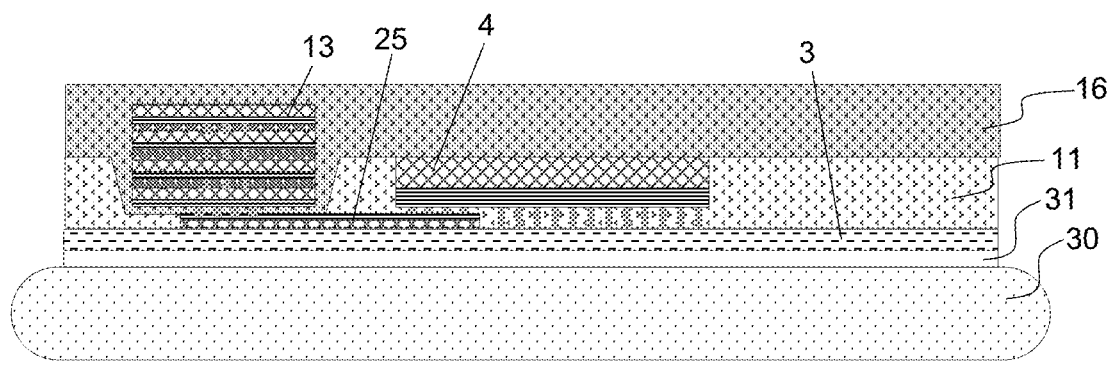
Figure 3I:
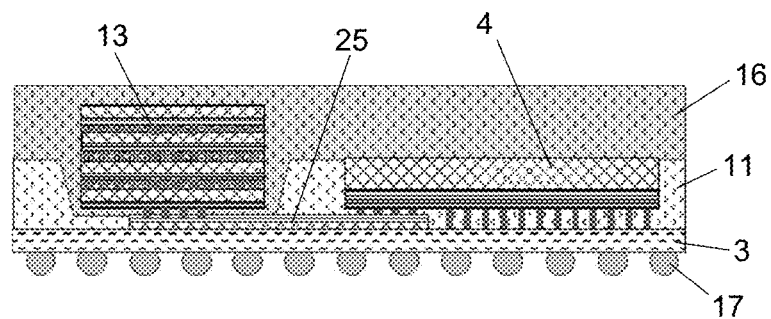

The assembly of the mold substrate 11 and the RDL 3 is then released from the temporary substrate 1, flipped and bonded to a second temporary substrate 30, provided with a second adhesive 31 (see FIG. 3E). The sacrificial material of the block 10 is then removed by a suitable removal technique in accordance with the type of sacrificial material used (see FIG. 3F). This creates an opening 32. At the bottom of this opening, an array of I/O contacts is exposed on the front surface of the bridge device 25. At this point, the logic die 4 may be tested. If the die 4 passes the tests, a stack 13 of memory dies is bonded to the array of exposed I/O contacts (see FIG. 3G) at the bottom of opening 32. A second overmolding step is then performed, forming a second mold substrate 16 that embeds the memory die stack 13, forming a reconstructed wafer comprising the RDL 3 and the stack of the first and second mold substrates 11 and 16 (FIG. 3H). The reconstructed wafer is then released from the second temporary substrate 30 and package level solder balls 17 are formed, followed by the singulation of the reconstructed wafer to form a single package (FIG. 3I), or alternatively the packages are singulated prior to the release from the second temporary substrate 30.

A number of the above-described features are not to be understood as limitations to the scope of the disclosed technology. The thinning step may be performed by other means instead of by planarization through grinding and/or CMP. The thinning could be local, performed by lithography and etching in an area including the sacrificial structures which are to be removed. Etching is then performed until an upper surface of such a sacrificial structure is exposed.

The disclosed technology is equally related to a wafer assembly obtainable as an intermediary product of the method of the disclosed technology, and that allows testing of the first die 4 prior to mounting the second dies 13. This is the assembly illustrated in FIGS. 1F and 3F for the two embodiments described above. The assembly includes a carrier (1 or 30) onto which a first mold substrate 11 is releasably attached. This includes the possibility of having the mold substrate 11 fixedly attached to an RDL 3 that is itself releasably attached to the carrier. The mold substrate 11 includes the first die 4 embedded therein, and an opening 12 or 32 having contacts at the bottom which are connected to contacts on the die 4.

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the disclosed technology, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A method of packaging one or more first semiconductor dies together with one or more second semiconductor dies electrically connected to the one or more first dies, the method comprising:
   by a first overmolding, embedding a first die together with a block formed of a sacrificial material in a first mold substrate, wherein the block is located to one side of the first die;
   removing the sacrificial material from the first mold substrate, to thereby create an opening in the first mold substrate, the bottom of the opening comprising exposed contacts which are electrically connected to the first die through a redistribution layer, wherein the first mold substrate is removably attached to a temporary carrier, the temporary carrier disposed on a side of the redistribution layer opposite the opening, and wherein the opening is configured to receive a second die or a stack of second dies to be mounted in the opening after allowing the first die to be tested;
   bonding the second die or the stack of second dies to the bottom of the opening, thereby electrically connecting the second die or the stack of second dies to the exposed contacts; and
   by a second overmolding, embedding the second die or the stack of second dies in a second mold substrate, thereby forming an assembly of the first and second mold substrates into which assembly the first and second dies are packaged.

2. The method according to claim 1, wherein the first die and the sacrificial block are both attached to the redistribution layer prior to the first overmolding, the redistribution layer being releasably attached to the temporary carrier, and wherein:
   the redistribution layer comprises the contacts which are to be exposed at the bottom of the opening formed by the removal of the sacrificial block,
   the first die is electrically connected to the redistribution layer, the redistribution layer comprising circuitry which connects the first die to the contacts which are to be exposed at the bottom of the opening formed by the removal of the sacrificial block, and
   after the first overmolding and before removing the sacrificial material, thinning at least part of the first mold substrate so as to expose an upper surface of the sacrificial block.

3. The method according to claim 2, wherein thinning includes grinding the surface of the first mold substrate.

4. The method according to claim 2, wherein thinning exposes a surface of the first die, and wherein the method further comprises attaching an additional sacrificial block to the exposed surface of the first die, prior to the second overmolding, and wherein the additional sacrificial block is removed from the second mold substrate, so as to create a cavity above the first die.

5. The method according to claim 1, wherein:
   the first overmolding is performed on the temporary carrier to which the first die and the sacrificial block are attached, and wherein a bridge device overlaps the first die and the sacrificial block, the bridge device having a first surface that is attached to the first die and a second surface placed in contact with the block, the first and second surface being on the same side of the bridge device, the first and second surfaces comprising, respectively, a first and a second array of electrical contacts which may be individually interconnected inside the bridge device, and wherein the first array of contacts is bonded and electrically connected to corresponding contacts on the first die, and
   the first mold substrate is released from the temporary carrier, flipped and attached to a second temporary carrier, followed by removing the sacrificial material of the block, thereby creating the opening, wherein the exposed contacts at the bottom of the opening are the contacts of the second array of contacts on the second surface of the bridge device.

6. The method according to claim 5, further comprising:
   after the first overmolding, thinning the first mold substrate, including the bridge device, until a set of contact bumps on the first die is exposed; and
   forming the redistribution layer on the thinned first mold substrate, the redistribution layer comprising circuitry that is electrically connected to the exposed contact bumps on the first die,
   wherein releasing the first mold substrate from the temporary carrier is executed by releasing the assembly of the first mold substrate and the redistribution layer.

7. The method according to claim 1, wherein the assembly of the first and the second mold substrate forms at least part of a reconstructed wafer, and wherein the method further comprises singulating the reconstructed wafer to form a package comprising the first die and the second die or comprising the first die and the stack of second dies.

8. The method according to claim 1, further comprising testing the first die prior to bonding the second die or the stack of second dies, the testing taking place by accessing the first die via the exposed contacts at the bottom of the opening formed by removing the sacrificial material of the block.

9. The method according to claim 1, wherein the block formed of sacrificial material is produced by 3D printing.

10. The method according to claim 1, wherein the one or more first dies are logic dies, and wherein the one or more second dies are memory dies.

11. A wafer assembly comprising a carrier, to which a mold substrate is removably attached, the mold substrate comprising a first die embedded therein, and wherein the mold substrate comprises an opening located to one side of the first die, wherein the opening is open to a surface of the mold substrate, the bottom of the opening comprising exposed contacts which are electrically connected to the first die through a redistribution layer, wherein the carrier is disposed on a side of the redistribution layer opposite the opening, and wherein the opening is configured to receive a second die to be mounted in the opening after allowing the first die to be tested.

12. The wafer assembly according to claim 11, wherein the mold substrate is attached to the redistribution layer that is itself releasably attached to the carrier, and wherein:
   the first die is electrically connected to the redistribution layer,
   the redistribution layer comprises the exposed contacts at the bottom of the opening, and
   the redistribution layer comprises circuitry which connects the first die to the contacts which are exposed at the bottom of the opening.

13. The wafer assembly according to claim 11, wherein the first die is attached to a bridge device that is co-embedded in the first mold substrate, the bridge device having a first surface that is attached to the first die and a second surface at the bottom of the opening, the first and second surface being on the same side of the bridge device, the first and second surfaces comprising, respectively, a first and a second array of electrical contacts which may be individually interconnected inside the bridge device, and wherein the first array of contacts is bonded and electrically connected to corresponding contacts on the first die.

\* \* \* \* \*